(12) United States Patent
Tsorng et al.

(10) Patent No.: US 10,973,139 B1
(45) Date of Patent: Apr. 6, 2021

(54) FLEXIBLE MODULARIZED SUPPORT DEVICE

(71) Applicant: Quanta Computer Inc., Taoyuan (TW)

(72) Inventors: Yaw-Tzorng Tsorng, Taoyuan (TW); Chun Chang, Taoyuan (TW); Jun-Yu Chen, Taoyuan (TW); Ting-Kuang Pao, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 15/929,855

(22) Filed: May 26, 2020

(51) Int. Cl.
| | | |
|---|---|---|
| *G06F 1/16* | (2006.01) | |
| *H05K 5/00* | (2006.01) | |
| *H05K 7/00* | (2006.01) | |
| *H05K 5/02* | (2006.01) | |
| *H05K 7/14* | (2006.01) | |

(52) U.S. Cl.
CPC ......... *H05K 5/0286* (2013.01); *H05K 5/0221* (2013.01); *H05K 7/1417* (2013.01); *H05K 7/1424* (2013.01); *H05K 7/1435* (2013.01)

(58) Field of Classification Search
CPC .. H05K 5/0286; H05K 5/0221; H05K 7/1417; H05K 7/1424; H05K 7/1435; G06F 1/183; G06F 1/185; G06F 1/186; G06F 1/187
See application file for complete search history.

(56) References Cited

U.S. PATENT DOCUMENTS

| 5,339,221 A | * | 8/1994 | Conroy-Wass | ...... H05K 7/1424 361/784 |
|---|---|---|---|---|
| 2004/0240173 A1 | * | 12/2004 | Yi | ............... G06F 1/184 361/679.02 |
| 2007/0087594 A1 | * | 4/2007 | Kosugi | ............... H05K 7/1461 439/92 |
| 2008/0055876 A1 | * | 3/2008 | Fan | ........................ G06F 1/185 361/801 |
| 2012/0020037 A1 | * | 1/2012 | Chiu | ........................ G06F 1/185 361/759 |
| 2012/0033388 A1 | * | 2/2012 | Peng | ........................ G06F 1/185 361/737 |
| 2013/0027875 A1 | * | 1/2013 | Zhu | ........................ H05K 7/1487 361/679.58 |
| 2014/0106595 A1 | * | 4/2014 | Zhu | ........................ H01R 13/62 439/345 |
| 2014/0160701 A1 | * | 6/2014 | He | ........................ H05K 7/1402 361/756 |

* cited by examiner

*Primary Examiner* — Anthony M Haughton
(74) *Attorney, Agent, or Firm* — Nixon Peabody LLP

(57) ABSTRACT

A flexible modularized system is configured to support graphics processing unit (GPU) cards of different dimensions. The system includes a riser bracket with attachment features for being coupled to a printed circuit board (PCB). The system further includes a fixing plate that is coupled to the riser bracket and which includes a plurality of adjustable holes. The system also includes a moving plate that is adjustably coupled to the fixing plate. The moving plate is movable between a plurality of positions. The moving plate has a first end that includes at least one latch, which engages the first adjustable hole in a first position and the second adjustable hole in a second position. The moving plate has a second end that is configured to secure in place one of the GPU cards relative to the PCB.

20 Claims, 20 Drawing Sheets

FLEXIBLE MODULARIZED SUPPORT DEVICE

FIELD OF THE INVENTION

The present invention relates generally to an adjustable support device for a computer system, and more specifically, to a modular support device for adjustably accommodating graphics processing unit ("GPU") cards of different dimensions.

BACKGROUND OF THE INVENTION

The performance of GPU cards drastically changes from day to day, requiring upgrades that impact the installation of the GPU cards. As processing power of the GPU cards changes, size and weight requirements of the GPU cards also change. The changes in dimensions and/or weight associated with the GPU cards require respective changes to supporting devices. However, present supporting devices are not capable of supporting more than a single size of the GPU cards. As such, when the size and/or weight of a GPU card changes, the supporting device has to be completely replaced. This problem is caused because existing supporting devices lack commonality and are typically designed for a specific GPU card (e.g., a single GPU card size). Moreover, some present supporting devices inadequately support the GPU card. Consequently, the GPU card is likely to easily fall off or jump out of a printed circuit board ("PCB") during shipment.

The present disclosure is directed to a modular support device that is flexibly adjustable to solve the above problems and other needs.

SUMMARY OF THE INVENTION

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings and each claim.

According to one aspect of the present disclosure, a flexible modularized system is configured to support graphics processing unit (GPU) cards of different dimensions. The system includes a riser bracket having attachment features for being fixedly coupled to a printed circuit board (PCB). The system further includes a fixing plate that is fixedly coupled to the riser bracket. The fixing plate includes a plurality of adjustable holes, which includes a first adjustable hole and a second adjustable hole. The system also includes a moving plate that is adjustably coupled to the fixing plate. The moving plate is movable between a plurality of positions, which includes a first position that is different from a second position. The moving plate has a first end that includes at least one latch, which engages the first adjustable hole in the first position and which engages the second adjustable hole in the second position. The moving plate has a second end that is configured to secure in place one of the GPU cards relative to the PCB.

According to an implementation of the above aspect, the system includes at least one fastener that fixes the fixing plate to the riser bracket.

According to a configuration of the above implementation, the at least one fastener is in the form of a T-shaped pin.

According to another configuration of the above implementation, the riser bracket includes at least one alignment aperture. The alignment aperture has an alignment hole connected to an alignment slot. The at least one fastener is initially received within the alignment hole. The at least one fastener is slidably movable along the alignment slot to a securing position. The fixing plate is fixed relative to the riser bracket in the securing position.

According to a more specific embodiment of this configuration, the at least one fastener includes a pair of fasteners. The at least one alignment aperture includes a pair of alignment apertures. Each fastener of the pair of fasteners is simultaneously inserted within a respective one of the pair of alignment apertures for achieving the securing position.

According to another implementation of the above aspect, the plurality of adjustable holes extends between a proximal end and a distal end of the fixing plate. The proximal end is farthest from an outer edge of the riser bracket. The distal end is closest to the outer edge of the riser bracket. The proximal end and the distal end define a length of the fixing plate.

According to a configuration of the above implementation, the plurality of adjustable holes is centrally located along a planar surface between lateral edges of the fixing plate. The lateral edges define a width of the fixing plate.

According to another configuration of the above implementation, the plurality of adjustable holes includes a first set of adjustable holes and a second set of adjustable holes. The first set of adjustable holes is located along a first side of the fixing plate, and the second set of adjustable holes is located along a second side of the fixing plate. The first side extends along a thickness of the fixing plate from a first lateral edge of the fixing plate. The second side extends along the thickness of the fixing plate from a second lateral edge of the fixing plate. The first lateral edge and the second lateral edge define a width of the fixing plate.

According yet another implementation of the above aspect, the at least one latch is centrally located along a planar surface. The at least one latch is located between lateral edges of the moving plate. The lateral edges define a width of the moving plate.

According to a configuration of the above implementation, the at least one latch has an arc-shaped element. The arc-shaped element is in a depressed state when the moving plate is adjusted between positions of the plurality of position. The arc-shaped element automatically rebounds to an undepressed state when the moving plate is in one of the plurality of positions.

According to yet another implementation of the above aspect, the at least one latch includes a first latch and a second latch. The first latch is located along a first side of the moving plate. The second latch is located along a second side of the moving plate. The first side extends along a thickness of the moving plate, from a first lateral edge of the moving plate. The second side extends along the thickness of the moving plate, from a second lateral edge of the moving plate. The first lateral edge and the second lateral edge define a width of the moving plate.

According to a configuration of the above implementation, the first latch has a first notch, and the second latch has a second notch. The first notch is symmetrical to the second notch relative to a central axis of the moving plate. The central axis extends parallel to the first lateral edge and to the second lateral edge.

According to yet another implementation of the above aspect, the fixing plate includes at least one locating protrusion. The riser bracket includes at least one locating dimple. The at least one locating protrusion is received within the at least one locating dimple when the fixing plate is aligned to the riser bracket in a fixed position.

According to another aspect of the present disclosure, a method is directed to supporting a plurality of graphics processing unit (GPU) cards. The plurality of GPU cards are supported with a flexible modularized system. The plurality of GPU cards include a first GPU card and a second GPU card, The first GPU card has a first set of dimensions. The second GPU card has a second set of dimensions. The first set of dimensions is different than the second set of dimensions. The method includes fixedly coupling a riser bracket to a printed circuit board (PCB). The method further includes fixedly coupling a fixing plate to the riser bracket. The fixing plate has a plurality of adjustable holes, which includes a first adjustable hole and a second adjustable hole. The method also includes adjustably coupling a moving plate to the fixing plate in a first position of the flexible modularized system. The first position corresponds to the first GPU card. The moving plate has at least one latch. The method also includes engaging, in the first position, the at least one latch to the first adjustable hole. The method also includes securing, in the first position, the first GPU card to the PCB with the moving plate. The method also includes movably adjusting the at least one latch to engage the second adjustable hole in a second position of the flexible modularized system. The method also includes securing, in the second position, the second GPU card to the PCB with the moving plate.

According to an implementation of the above aspect, the method also includes sliding fasteners of the fixing plate into receiving alignment slots of the riser bracket.

According to another implementation of the above aspect, the method also includes depressing the at least one latch to disengage from the first adjustable hole.

According to yet another implementation of the above aspect, the method also includes releasing the at least one latch to automatically engage the second adjustable hole.

According to yet another aspect of the present disclosure, a flexible modularized system is configured for supporting graphics processing unit (GPU) cards of different dimensions. The system includes a riser bracket fixedly coupled to a printed circuit board (PCB). The system further includes a fixing plate mounted to the riser bracket. The fixing plate has a plurality of adjustable holes, which includes a first adjustable hole and a second adjustable hole. The system also includes a moving plate that is adjustably coupled to the fixing plate. The moving plate has a first plate that is generally perpendicularly connected to a second plate. The first plate has a latch that engages the first adjustable hole when a first GPU card is coupled to the PCB. The second plate is in contact with the first GPU card when the latch engages the first adjustable hole. The moving plate is slidably movable to have the latch engage the second adjustable hole when a second GPU card is coupled to the PCB. The first GPU card has a different size than the second GPU card. The second plate is in contact with the second GPU card when the latch engages the second adjustable hole.

According to an implementation of the above aspect, the latch is located within a latch aperture of the first plate. The latch is located along a top side of the first plate. The latch consists of an elastic material that automatically returns to an undepressed state. The undepressed state is achieved after the latch is pressed to disengage a respective one of the plurality of adjustable holes. The plurality of adjustable holes is located along a top side of the fixing plate.

According to another implementation of the above aspect, the latch includes a pair of lateral arms. Each of the lateral arms is located along a respective lateral side of the first plate. Each lateral side extends generally perpendicularly from a top side of the first plate. Each of the lateral arms includes a notch for engaging a respective one of the plurality of adjustable holes. Each of the lateral arms consists of an elastic material that automatically returns to an undepressed state. The undepressed state is achieved after the lateral arms are pressed to disengage a respective one of the plurality of adjustable holes. The plurality of adjustable holes includes two sets of adjustable holes that are located along a respective lateral side of the fixing plate.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of exemplary embodiments together with reference to the accompanying drawings. These drawings depict only exemplary embodiments, and are therefore not to be considered as limitations on the scope of the various embodiments or claims.

Figure 1:
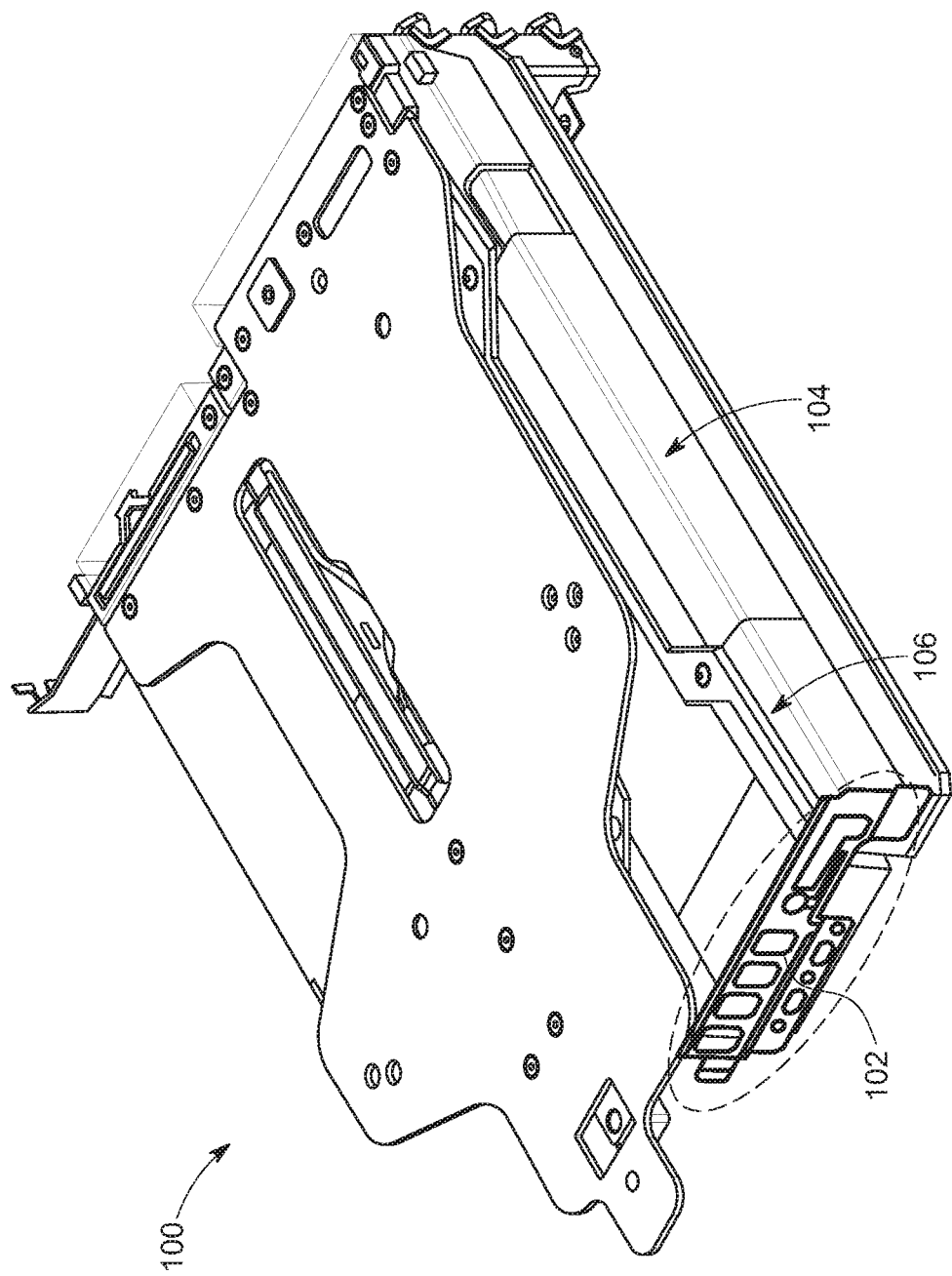
FIG. 1 is a perspective view of a prior art support device for a graphics processing unit (GPU) card.

While the invention is susceptible to various modifications and alternative forms, specific implementations have been shown by way of example in the drawings and will be described in further detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

Various embodiments are described with reference to the attached figures, where like reference numerals are used throughout the figures to designate similar or equivalent elements. The figures are not drawn to scale and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

Generally, the present disclosure describes a flexible modularized system that provides a beneficial configuration, which is highly flexible and adjustable, and which fits all sizes of add-on cards (including non-standard sizes). Another benefit of the disclosed flexible modularized system is that the installation process for an add-on card (or other device) is simple and tool-less. Yet another benefit of the disclosed flexible modularized system is that it provides a slim configuration, with less space limitations. Based on these and other benefits, the flexible modularized system facilitates a reduction in serves and/or replacement time, which, in turn, achieves less associated expenses.

Referring to FIG. 1, a conventional support device 100 has a support bracket 102 for fixing a GPU card 104 to a support frame 106. The support bracket 104 lacks any adjustability features, being designed to accommodate only a particular type of GPU card 104 that has a specific size and shape. If the GPU card 104 requires replacement, the replacement GPU card must have the exact size and shape as the GPU card 104 being replaced.

Figure 2:
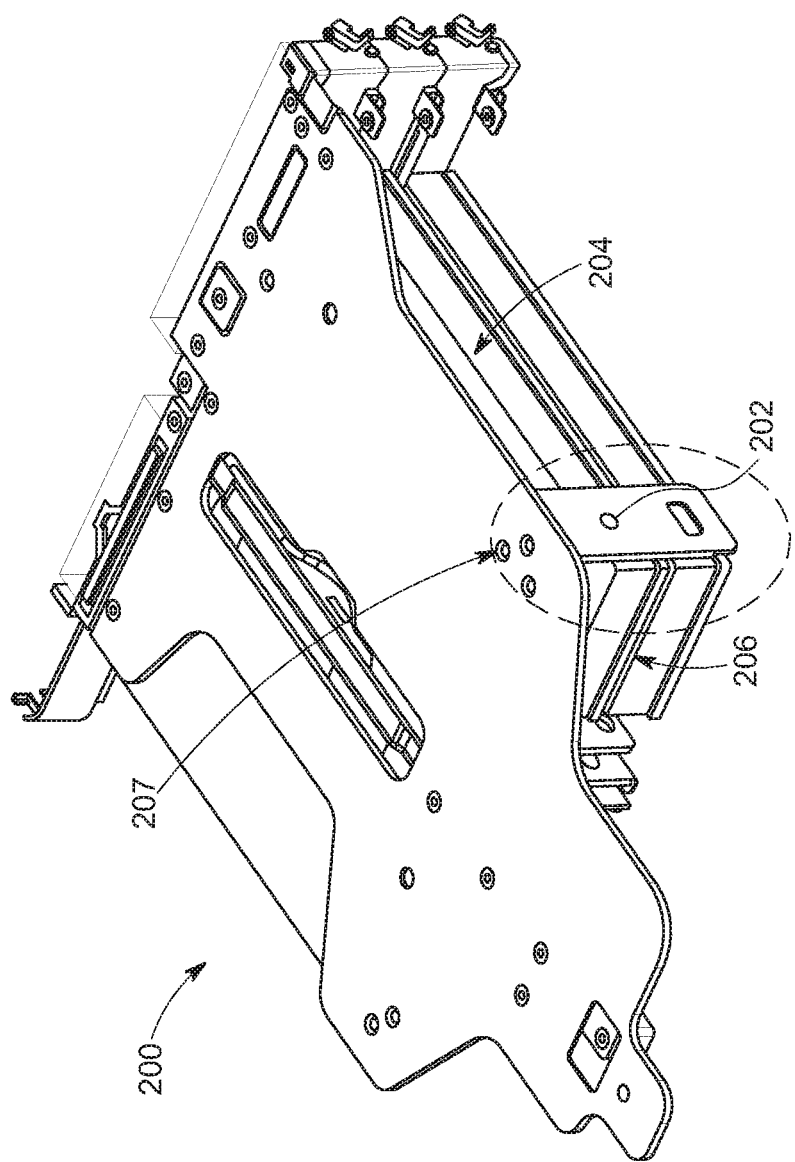
FIG. 2 is a perspective view of another prior art support device for a GPU card.

Referring to FIG. 2, another conventional support device 200 has a support bracket 202 for fixing a GPU card 204 to a support frame 206. The support bracket 202 is fixed to the support frame 206 via a plurality of fasteners 207. The support bracket 202 lacks any adjustability features, being designed to accommodate only a particular type of GPU card 204 that has a specific size and shape. The support bracket 202 requires tools to install and/or replace, adding unnecessary time and expenses when installation and/or maintenance is required. For example, a screwdriver is required to remove from and/or add the fasteners 207 to the support bracket 202. The disadvantages discussed above, as well as other disadvantages, are solved at least in part by the embodiments described below.

Figure 3:
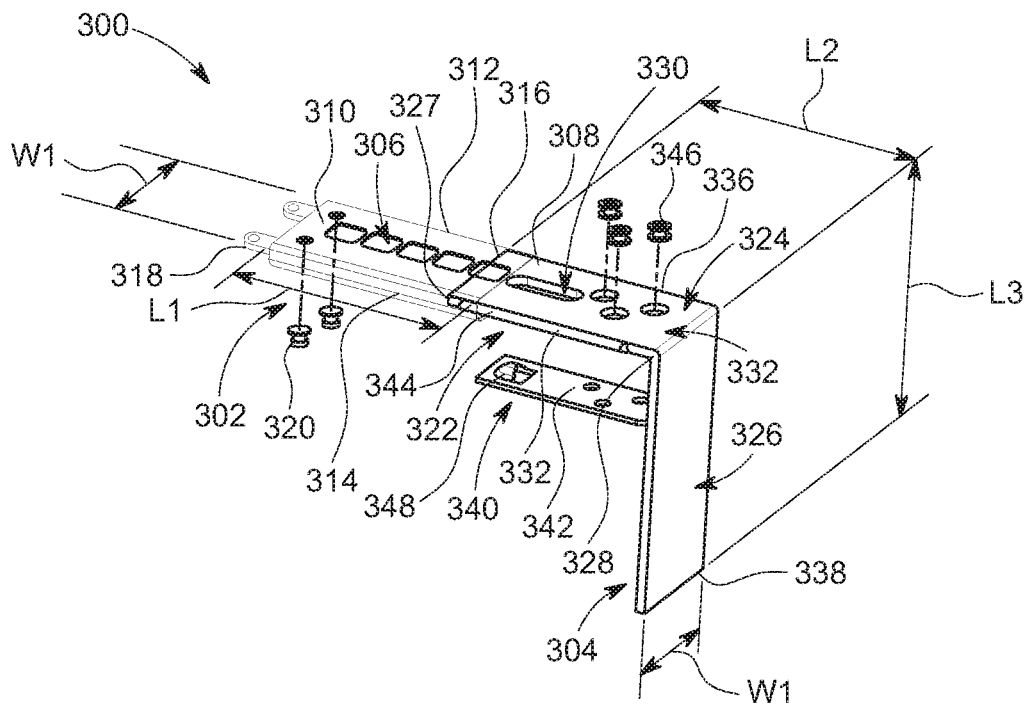
FIG. 3 is a perspective exploded view of a flexible modularized assembly, in accordance with some implementations of the present disclosure.
Figure 4:
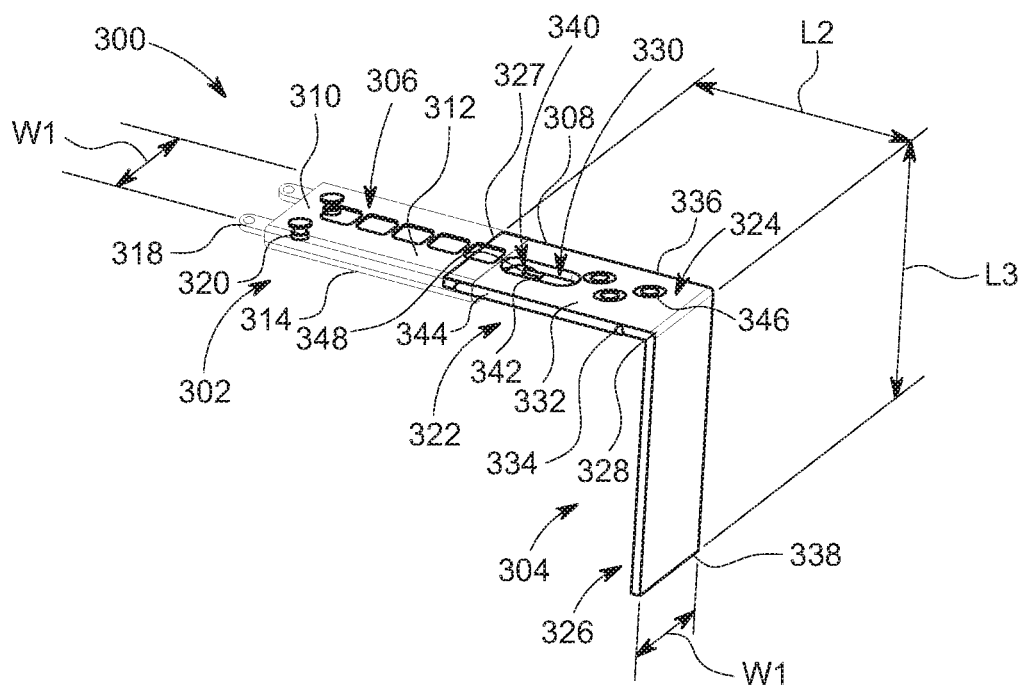
FIG. 4 is a perspective assembled view of the flexible modularized assembly of FIG. 3.

Referring to FIGS. 3 and 4, a flexible modularized system 300 includes a fixing plate 302 and a moving plate 304, according to an implementation of the present disclosure. The fixing plate 302 has a plurality of adjustable holes 306. The plurality of adjustable holes 306 extends between a proximal end 308 and a distal end 310. The proximal end 308 and the distal end 310 define a length L1 of the fixing plate 302.

The plurality of adjustable holes 306 is further, optionally, centrally located along a planar surface 312 between lateral edges 314, 316 of the fixing plate 302. The lateral edges 314, 316 define a W1 of the fixing plate 302.

The fixing plate 302 further includes two locating protrusions 318 at the distal end 310. Two fasteners in the form of T-pins 320 are further attached, respectively, near the locating protrusions 318 at the distal end 310. The T-pins 320 are received internally in a receiving area 322 of the fixing plate, near the distal end 310 of the fixing plate 302. The moving plate 304 is slidably received within the receiving area 322, near the proximal end 308 of the fixing plate 302.

The moving plate 304 has a first plate 324 that is generally perpendicularly connected to a second plate 326. The first plate 324 has a distal end 327 and a proximal end 328, which is at the intersection between the first plate 324 and the second plate 326. The distal end 327 and the proximal end 328 define a length L2 of the first plate 324. The first plate 324 and the second plate 326 form a general L-shape.

The moving plate 304 includes an elongated aperture 330 located in a central location on a planar surface 332. The elongated aperture 330 is between lateral edges 334, 336 of the moving plate 304, which define a width W2 of the moving plate 304.

The second plate 326 extends between the proximal end 328 and a fixing end 338. The proximal end 328 of the second plate 326 and the fixing end 338 define a length L3 of the second plate 326.

The moving plate 304 includes a latch plate 340 that has a top surface 342. The top surface 342 is attached to a bottom surface 344 of the first plate 324. The latch plate 340 is attached to the first plate 324 via a plurality of rivets 346.

The latch plate 340 includes a latch 348 that is an arc shaped element, which is movable between an undepressed state and a depressed state. The latch 348 is position such that it protrudes in part through the elongated aperture 330 when the latch 348 is in the undepressed state.

Figure 5:
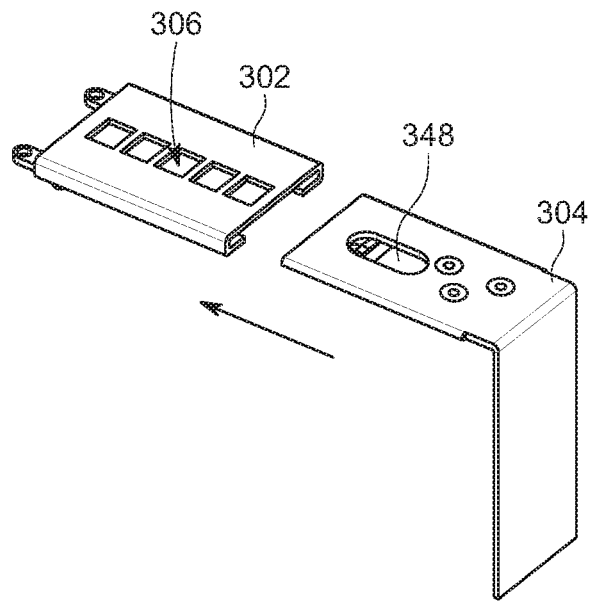
FIG. 5 is a perspective view illustrating a fixing plate in an unattached position relative to a movable plate of the flexible modularized assembly of FIGS. 3 and 4.
Figure 6:
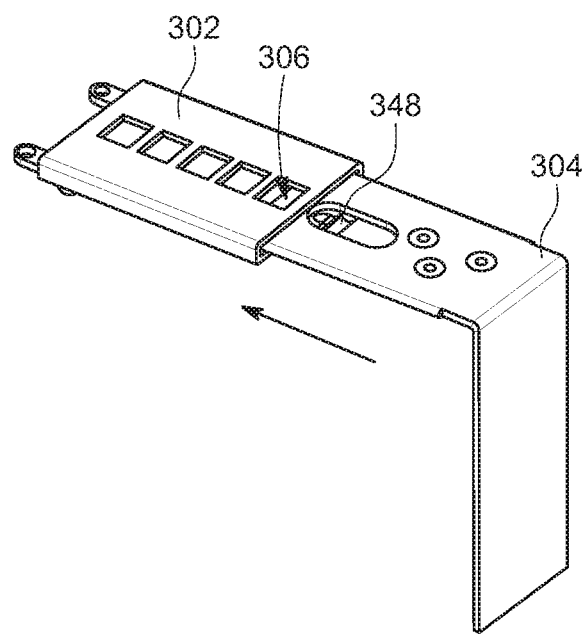
FIG. 6 is a perspective view illustrating the fixing plate in a partially attached position relative to the movable plate of FIG. 5.

Referring generally to FIGS. 5 and 6, the moving plate 304 is slidably adjustable relative to the fixing plate 302. Referring more specifically to FIG. 5, the latch 348 is positioned prior to engaging a respective one of the plurality of adjustable holes 306. Referring more specifically to FIG. 6, the moving plate 304 is moved towards the fixing plate 302. Consequently, as described in more detail below, the latch 348 begin engaging one of the plurality of adjustable holes 306.

Figure 7:
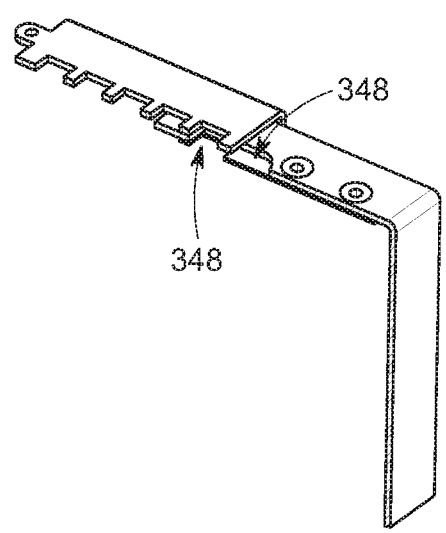
FIG. 7 is a cutaway perspective view illustrating engagement between a latch and an adjustable hole, in accordance with some implementations of the present disclosure.
Figure 8:
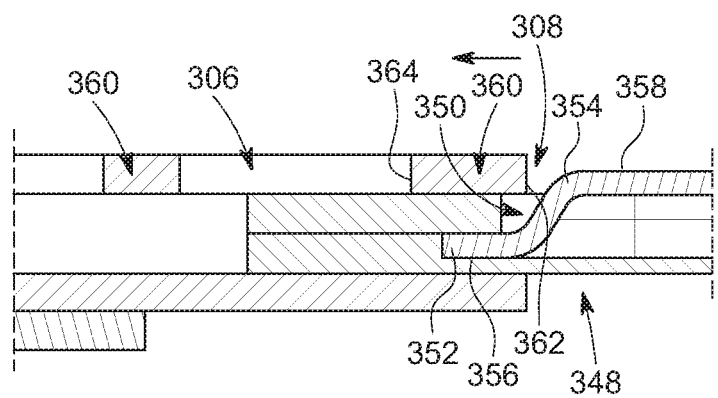
FIG. 8 is an enlarged side view representation prior to the engagement between the latch and the adjustable hole of FIG. 7.
Figure 9:
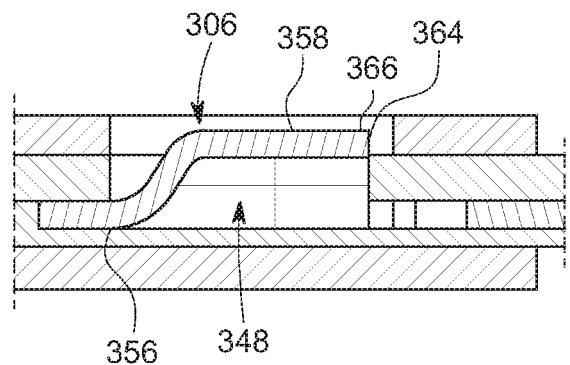
FIG. 9 is an enlarged side view representation after the engagement between the latch and the adjustable hole of FIG. 7.

Referring generally to FIGS. 7-9, the engagement between the latch 348 and an adjustable hole 306 will be described in more detail. Referring more specifically to FIG. 8, the latch 348 has a front area 350 that extends in an arc-shape between a lead end 352 and a trailing end 354. The lead end 352 is along a bottom surface 356, while the trailing end 354 is along a top surface 358.

Each of the adjustable holes 306 has a bridge area 360 that separates each of the adjustable holes 306 from an adjacent hole 306 or from a respective end of the fixing plate 302 (e.g., the proximal end 308). The bridge area 360 has an entry side 362 and a stop side 364. The entry side 362 allows the latch 348 to slide into a respective adjustable hole 306, while the stop side 364 prevents backward movement of the latch 348. When the lead end 352 of the latch 348 makes contact with the entry side 362, the top surface 358 is automatically pressed down to the depressed state of the latch 348.

Referring more specifically to FIG. 9, the latch 348 is now engaged within one of the adjustable holes 306. The latch 348 further includes a stop end 366 that abuts against the stop side 364. Thus, the latch 348 is automatically prevented from moving in a reverse direction, unless the top surface 358 is pressed towards the bottom surface 356.

Figure 10:
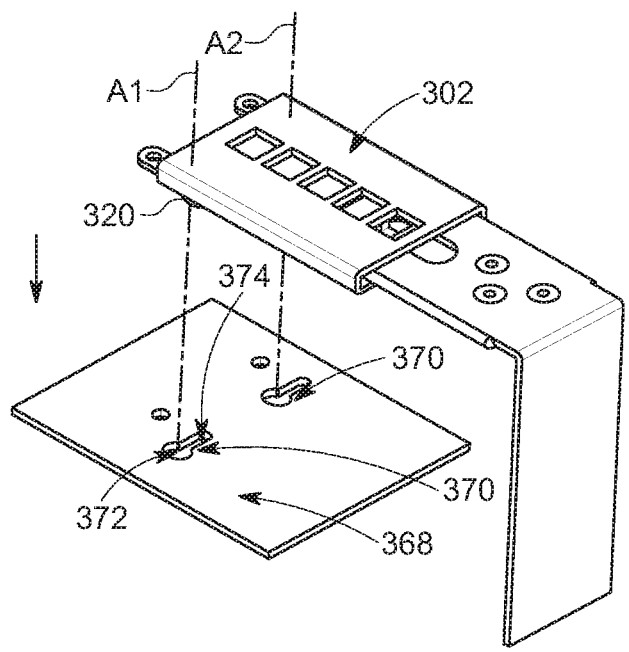
FIG. 10 is a perspective view illustrating mounting of a riser bracket to a fixing plate, according to some implementations of the present disclosure.
Figure 11:
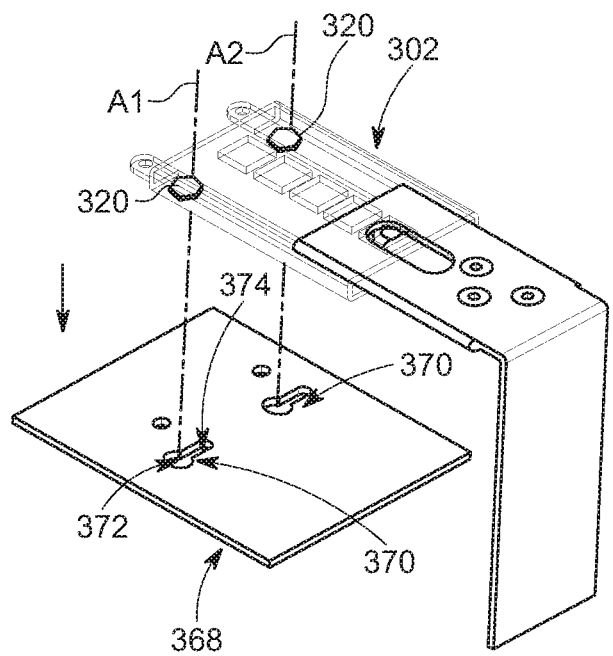
FIG. 11 is a perspective view illustrating mounting fasteners of the riser bracket of FIG. 10.

Referring generally to FIGS. 10-15, a riser bracket 368 is mounted to the fixing plate 302. Referring specifically to FIGS. 10 and 11, the riser bracket 368 has a plurality of alignment apertures 370. Each alignment aperture has an alignment hole 372 connected to an alignment slot 374. The alignment apertures 370 are aligned along alignment lines A1 and A2 with respective ones of the T-pins 320.

Figure 12:
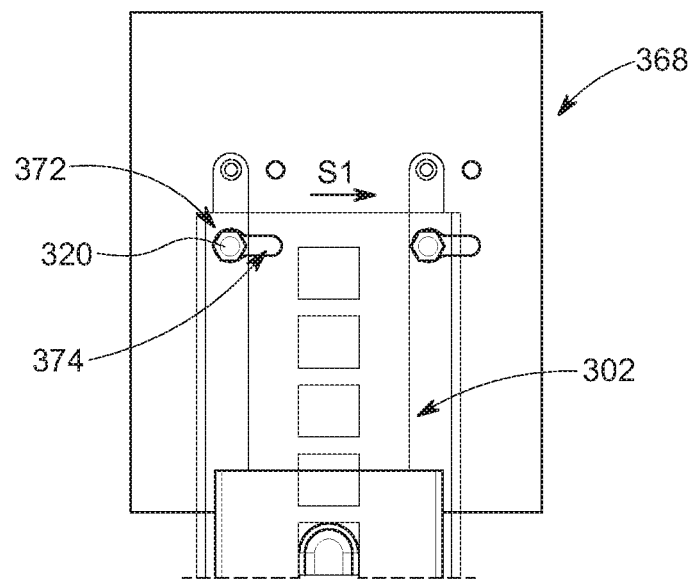
FIG. 12 is a partial top view illustrating the riser bracket and fixing plate of FIG. 10.
Figure 13:
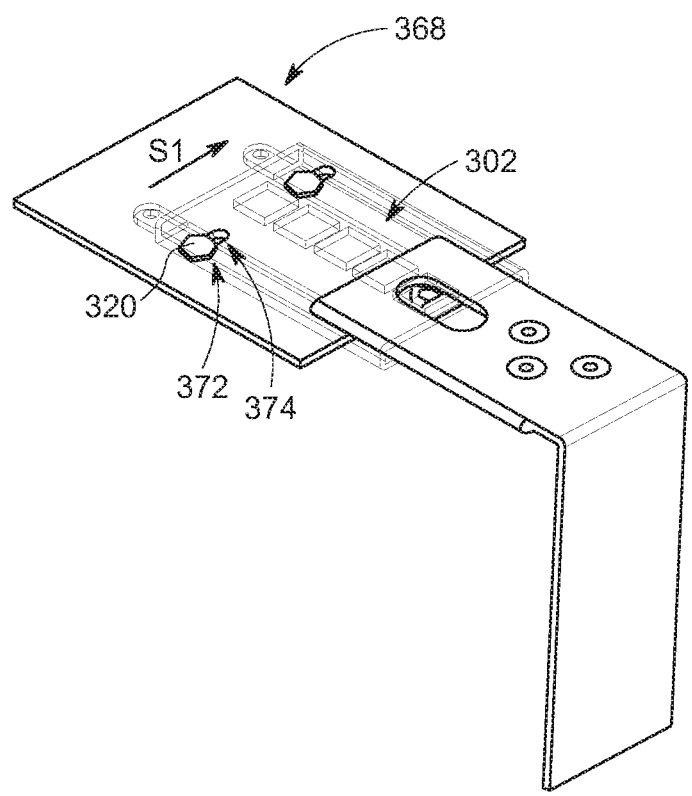
FIG. 13 is a perspective view illustrating the riser bracket mounted to the fixing plate of FIG. 10.
Figure 14:
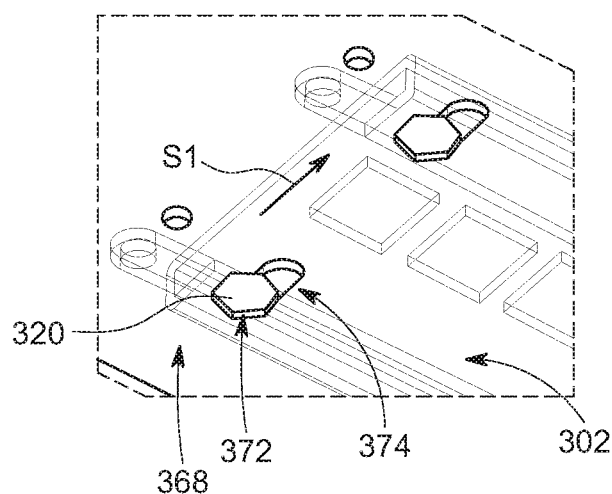
FIG. 14 is an enlarged view illustrating the fasteners of the fixing plate mounted to the riser bracket of FIG. 10.

Referring specifically to FIGS. 12-14, the T-pins 320 are illustrated as inserted within the alignment apertures 370, respectively. Each T-pin 320 is initially received within the respective alignment hole 372, being free to slidably move in a securing direction S1 towards a securing position along the alignment slot 374.

Figure 15:
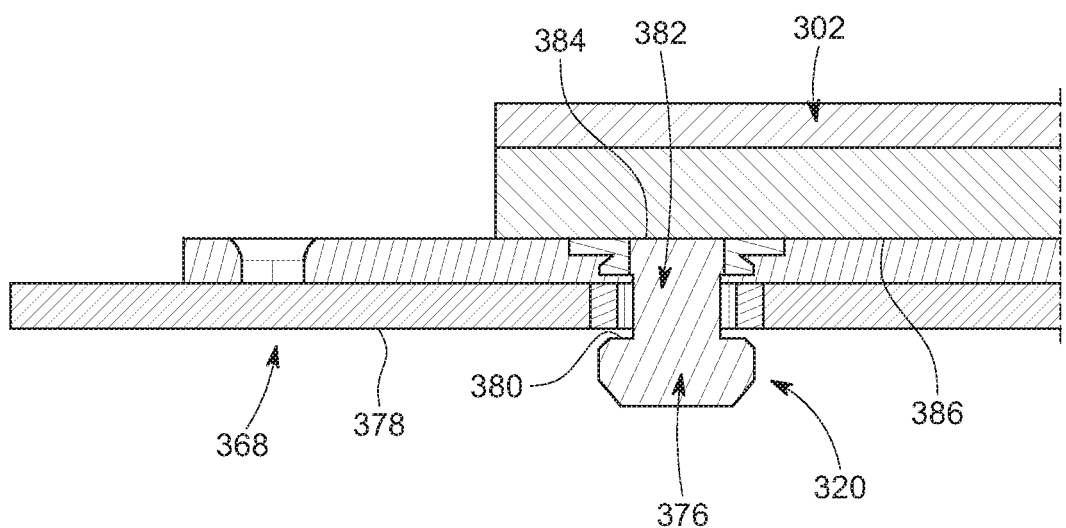
FIG. 15 is an enlarged side cross-sectional view illustrating mounting of the fixing plate and the riser bracket of FIG. 10.
Figure 16:
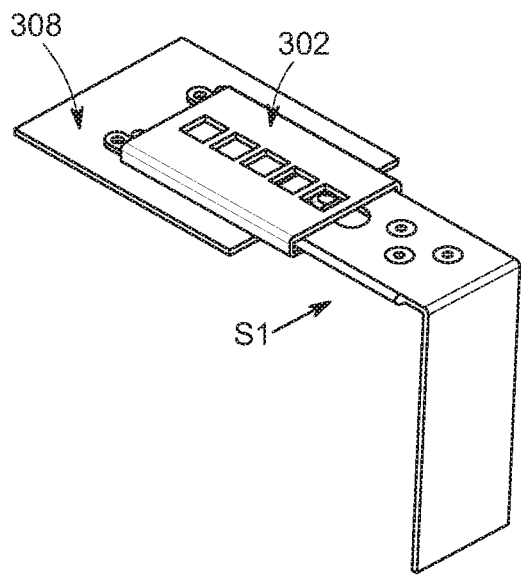
FIG. 16 is a perspective view illustrating a riser bracket before being in a secured position relative to a fixing plate, according to some implementations of the present disclosure.
Figure 17:
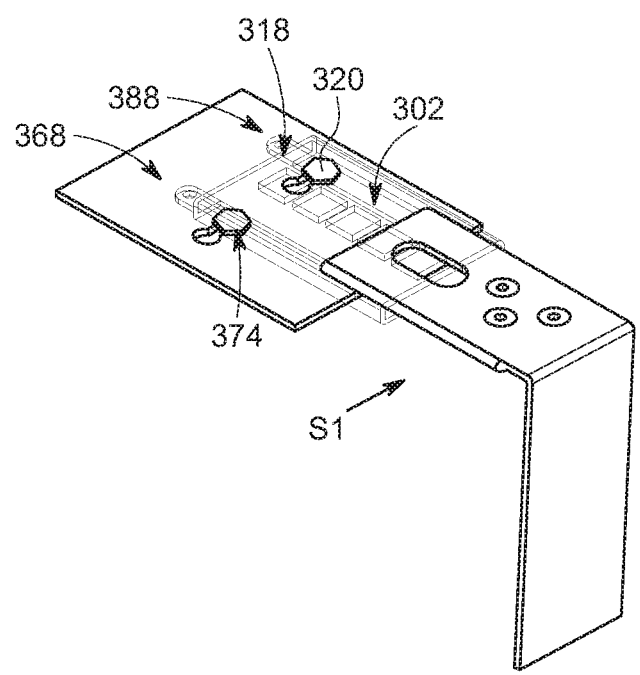
FIG. 17 illustrates the riser bracket of FIG. 16 in the secured position relative to the fixing plate.
Figure 18:
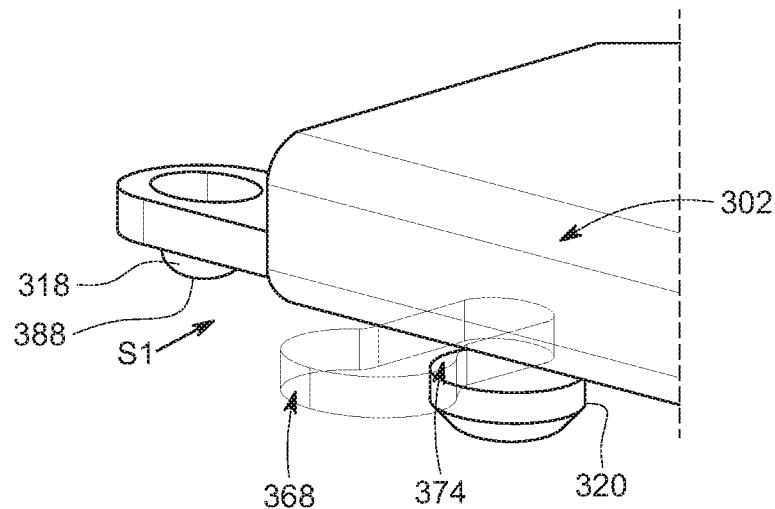
FIG. 18 is an enlarged perspective view illustrating the position of a fastener and a dimple relative to respective receiving features in the riser bracket of FIG. 16.
Figure 19:
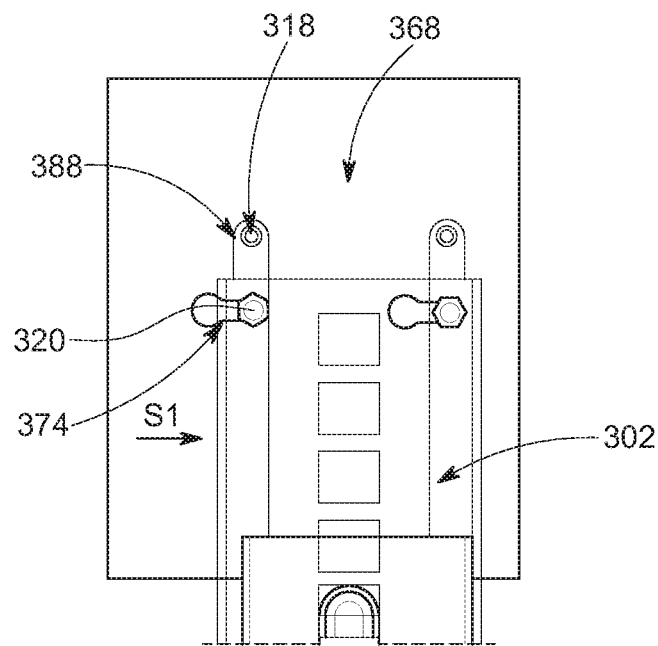
FIG. 19 is a partial top view of FIG. 16 showing a position of the fasteners and dimples.
Figure 20:
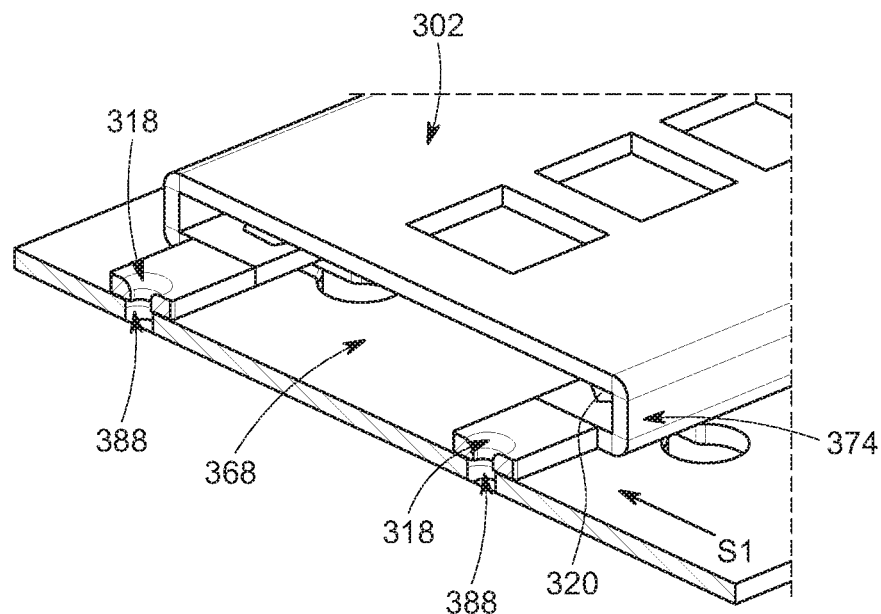
FIG. 20 is a partial perspective view of FIG. 16 showing a position of the fasteners and dimples.

Referring specifically to FIG. 15, a head 376 of the T-pin 320 extends beyond a bottom surface 378 of the riser bracket 368. A securing surface 380 of the head 376 is near or in contact with the bottom surface 378 when the riser bracket 368 is mounted to the fixing plate 302. A support element 382 extends generally perpendicular from the head 376, providing the T-shape of the T-pin 320. A fixing end 384 of the support element 382 is fixed near to or in contact with an internal bottom surface 386 of the fixing plate 302.

Referring generally to FIGS. 16-20, the fixing plate 302 slides from left to right, along the securing direction S1, to fixedly couple the fixing plate 302 to the riser bracket 368. Referring more specifically to FIGS. 17-20, the T-pins 320 slidably move in the securing direction S1 along the alignment slots 374. The T-pins 320 move until the locating protrusions 318 self-locate within respective locating dimples 388 of the riser bracket 368. When the locating protrusions 318 are received within (or engaged with) the locating dimples 388, the fixing plate 302 is aligned to the riser bracket 368 in a fixed position.

Figure 21:
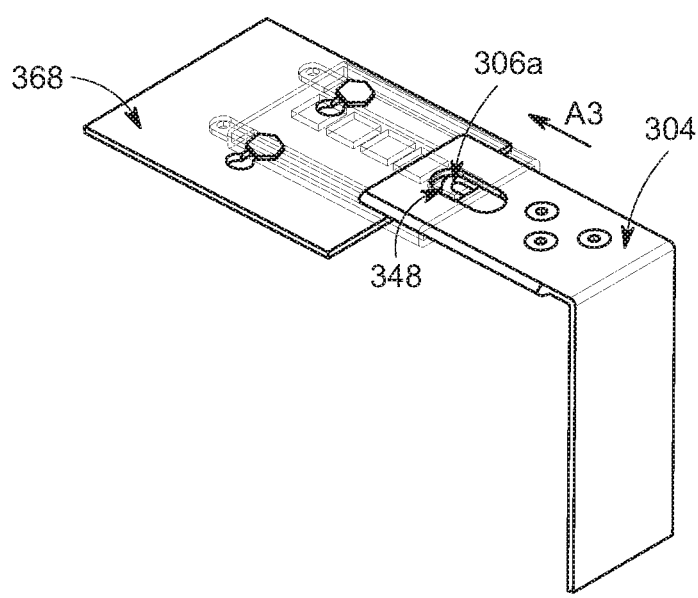
FIG. 21 is a perspective view illustrating a first adjustment position of a flexible modularized system, according to some implementations of the present disclosure.
Figure 22:
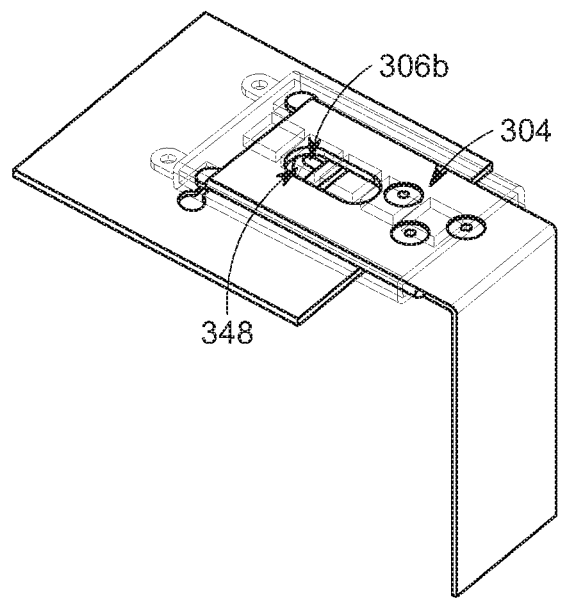
FIG. 22 is a perspective view illustrating a second adjustment position of the flexible modularized system of FIG. 21.
Figure 23:
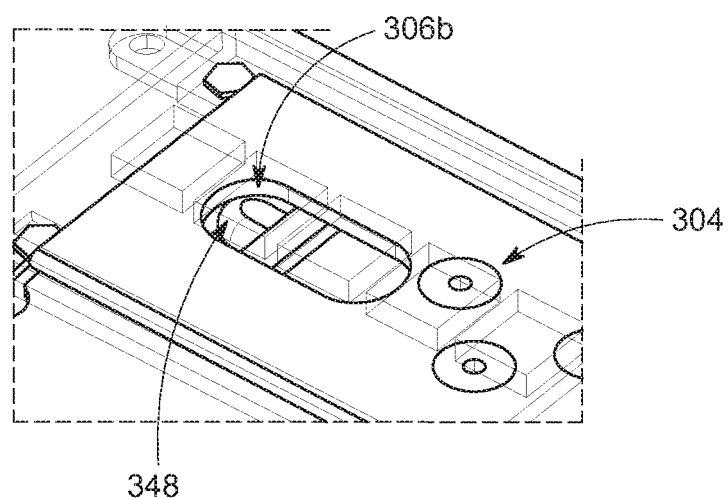
FIG. 23 is an enlarged view illustrating a latch of the flexible modularized system of FIG. 21.

Referring to FIGS. 21-23, the moving plate 304 is movable between a plurality of positions. Referring specifically to FIG. 21, the moving plate 304 is initially in a first position, in which the latch 348 is engaged in a first adjustable hole 306a. The moving plate 304 is adjustable in an adjustable direction A3, towards the riser bracket 368. Referring specifically to FIGS. 22 and 23, the moving plate 304 is now in a second position, in which the latch 348 is engaged in a second adjustable hole 306b. The moving plate 304 can freely move forward, in the adjustable direction A3, through the adjustable holes 306a, 306b based at least in part on the arc-shaped element of the latch 348 (which is described in more detail above).

Figure 24:
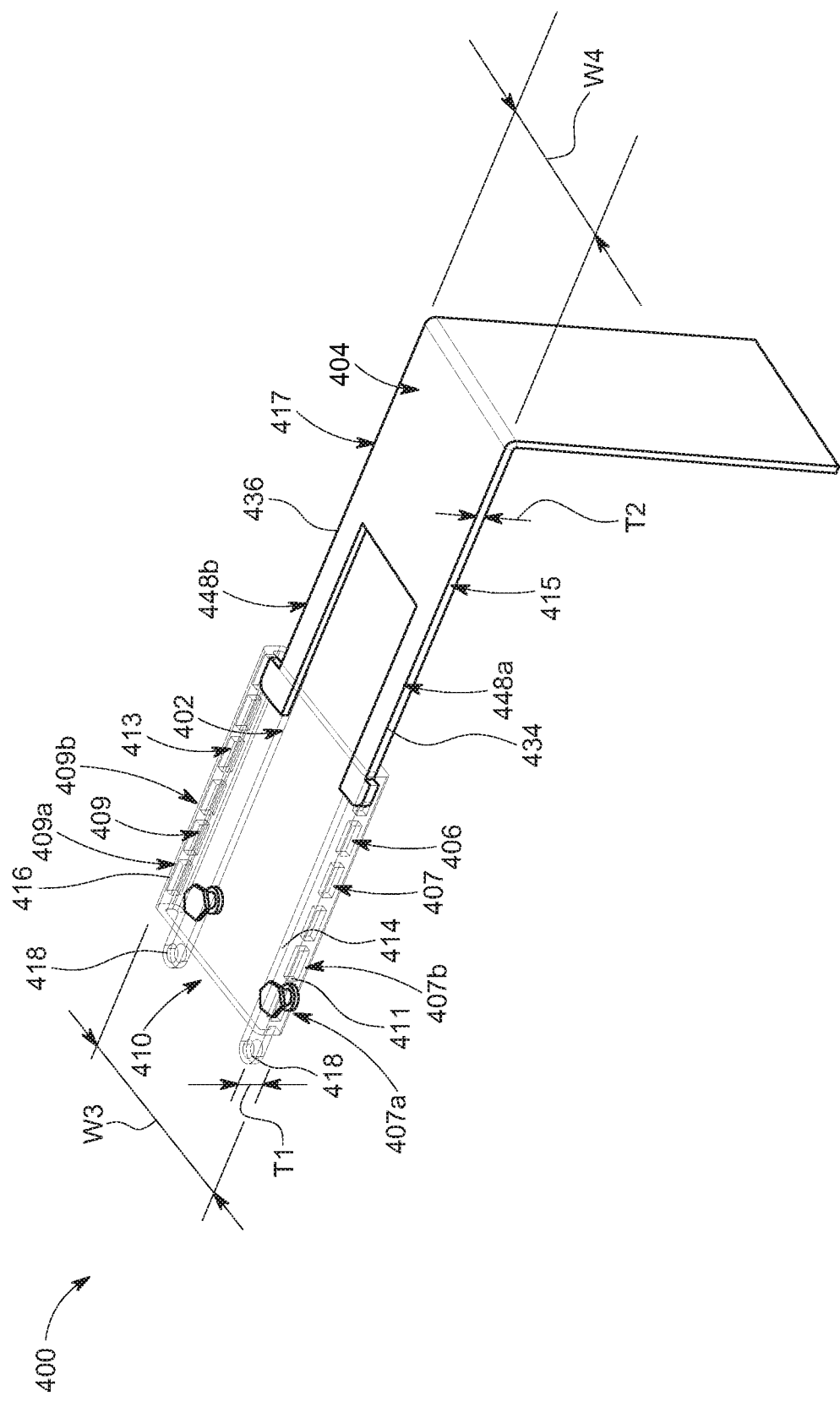
FIG. 24 is a perspective view of another flexible modularized assembly, in accordance with some implementations of the present disclosure.

Referring to FIG. 24, a flexible modularized system 400 includes a fixing plate 402 and a moving plate 404, according to an alternative implementation of the present disclosure. The fixing plate 402 has a plurality of adjustable holes 406, which includes a first set of adjustable holes 407 and a second set of adjustable holes 409. The first set of adjustable holes 407 includes at least a first adjustable hole 407a and a second adjustable hole 407b. The second set of adjustable holes 409 includes at least a second adjustable hole 409a and a second adjustable hole 409b. Although not specifically illustrated or described, the flexible modularized system 400 optionally includes the riser bracket 368 illustrated above in reference to FIGS. 10-15. Optionally yet, the riser bracket 368 is mounted to the fixing plate 402 similarly to the fixing plate 302, including, for example, the T-pins 320 and the alignment holes 372.

The first set of adjustable holes 407 is located along a first side 411 of the fixing plate 402. The first side 411 extends along a thickness T1 of the fixing plate 402. The first side 411 extends from a first lateral edge 414 of the fixing plate 402.

The second set of adjustable holes 409 is located along a second side 413 of the fixing plate 402. The second side 413 extends along the thickness T1 of the fixing plate 402. The second side 413 extends from a second lateral edge 416 of the fixing plate 402. The first side 411 and the second side 413 define a width W3 of the fixing plate 402.

The fixing plate 402 further has two locating protrusions 418 at a distal end 410. The locating protrusions 418 are generally similar or identical to the locating protrusions 318 described above in reference to FIG. 3. The locating protrusions 418 generally function similar to the locating protrusions 318 described above in reference to FIG. 3.

The moving plate 404 is generally similar to the moving plate 304 described above in reference to FIG. 3, except that it has two latches 448a, 448b (instead of a single latch 348). A first latch 448a is located along a first side 415 of the moving plate 404. The first side 415 extends along a thickness T2 of the moving plate 404. The first side 415 extends from a first lateral edge 434 of the moving plate 404.

A second latch 448b is located along a second side 417 of the moving plate 404. The second side 417 extends along the thickness T2 of the moving plate 404. The second side 417 extends from a second lateral edge 436 of the moving plate 404. The first lateral edge 434 and the second lateral edge 436 define a width W4 of the moving plate 404.

Figure 25:
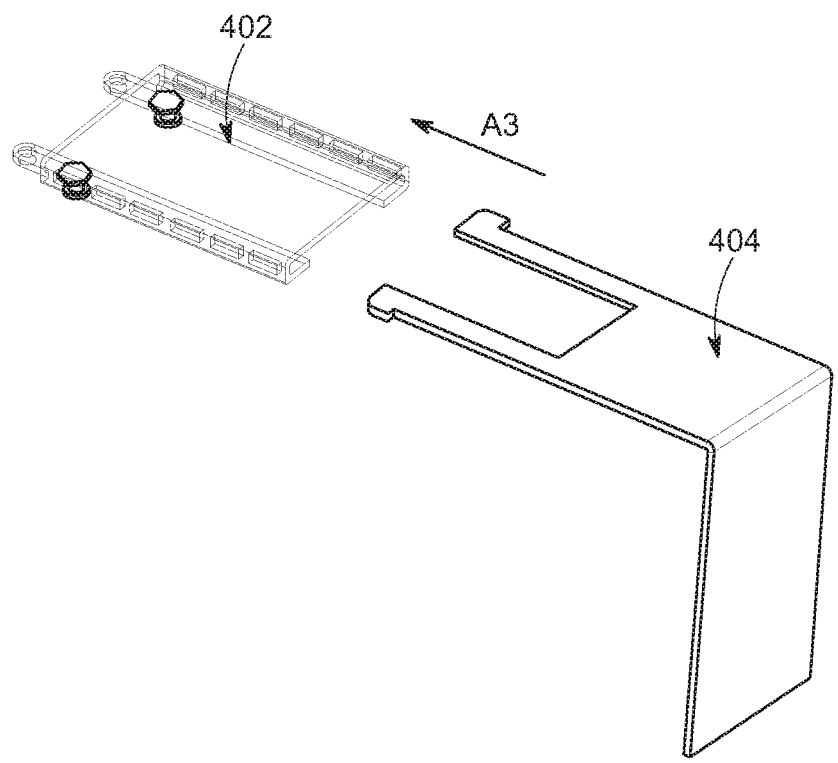
FIG. 25 is a perspective view illustrating a fixing plate in an unattached position relative to a movable plate of the flexible modularized assembly of FIG. 24.
Figure 26:
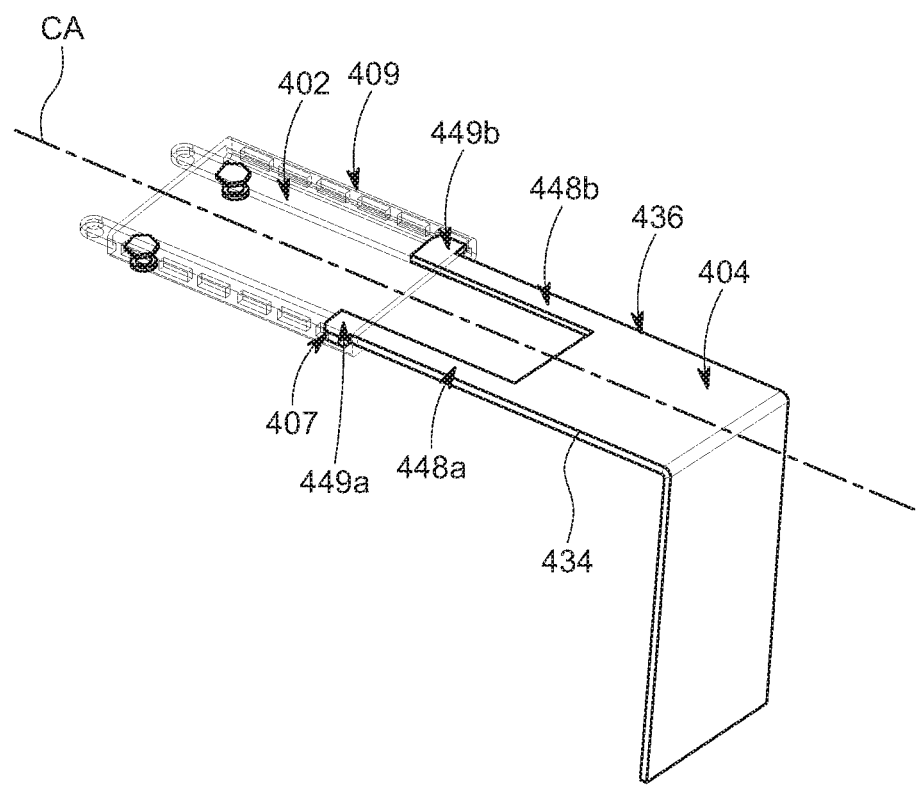
FIG. 26 is a perspective view illustrating the fixing plate in an attached position relative to the movable plate of the flexible modularized assembly of FIG. 24.
Figure 27:
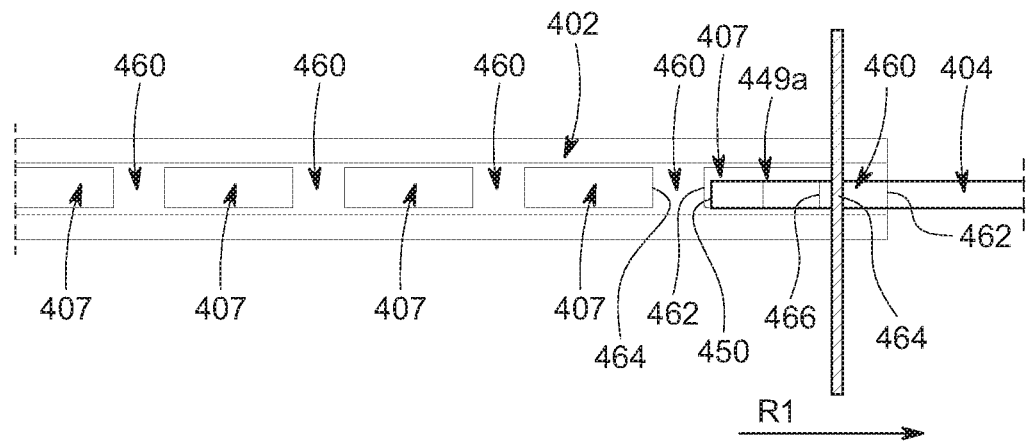
FIG. 27 is an enlarged side cross-sectional view illustrating engagement between a latch and an adjustable hole of the flexible modularized assembly of FIG. 26.

Referring generally to FIGS. 25-27, the moving plate 404 is illustrated moving from an unattached position relative to the fixing plate 402 (shown in FIG. 25) to an attached position (shown in FIGS. 26 and 27). Referring specifically to FIG. 25, the moving plate 404 is initially moved in the adjustable direction A3.

Referring specifically to FIG. 26, the two latches 448a, 448b are now engaged with respective adjustable holes 407, 409. The two latches 448a, 448b have respective first and second notches 449a, 449b. According to the illustrated example, the first notch 449a is symmetrical to the second notch 449b relative to a central axis CA of the moving plate 404. The central axis CA extends parallel to the first and second lateral edges 434, 436 of the moving plate 404.

Referring specifically to FIG. 27, the engagement between the first notch 449a and the adjustable hole 407 will be described in more detail. The first notch 449a has a front end 450 that abuts against an entry side 462 of a bridge area 460. Similar, but not identical, to the adjustable holes 306 illustrated in FIG. 3, the adjustable hole 407 has a plurality of bridge areas 460. The bridge areas 460 separate adjacent adjustable holes 407 from each other, or from a respective end of the fixing plate 402. Each bridge area 460 has the entry side 462 and a stop side 464. The entry side 462 allows the first notch 449a to slide into the respective adjustable hole 407, while the stop side 464 prevents backward movement of the first notch 449a. Specifically, the stop side 464 prevents a trailing end 466 of the first notch 449a from moving in a reverse direction R1, unless the first notch 449a is pressed in an inward direction. Although not specifically described, the second notch 449b (illustrated in FIG. 26) functions in a symmetrical manner to the first notch 449a.

Figure 28:
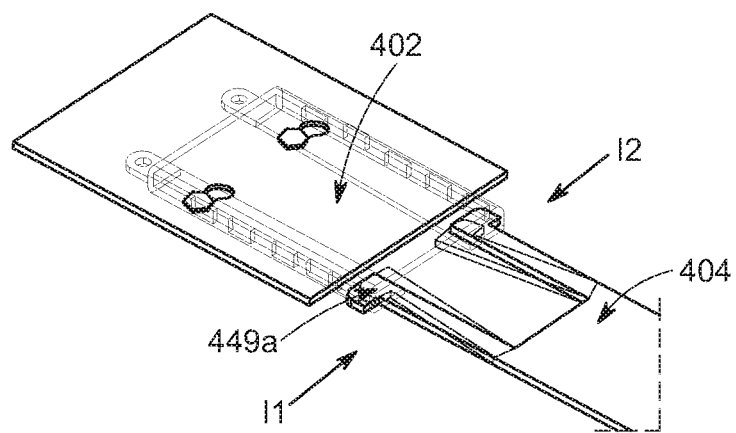
FIG. 28 is a partial perspective view illustrating the flexible modularized assembly of FIG. 24 with a riser bracket and prior to attachment of the movable plate.
Figure 29:
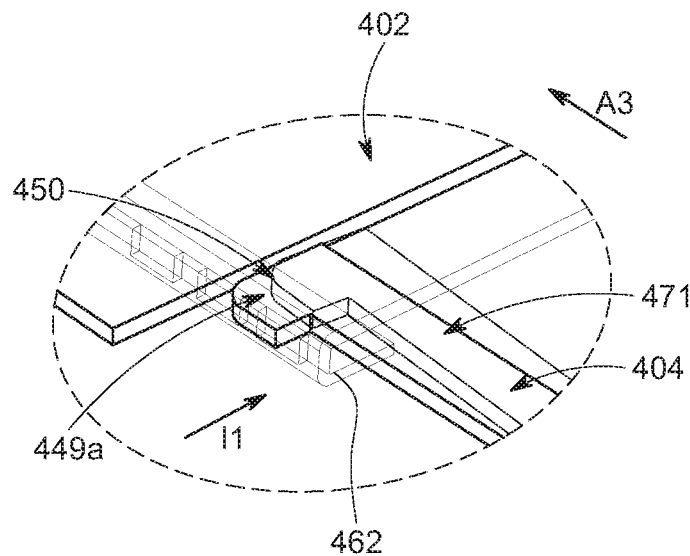
FIG. 29 is an enlarged perspective view of FIG. 28 illustrating movement of the latch.
Figure 30:
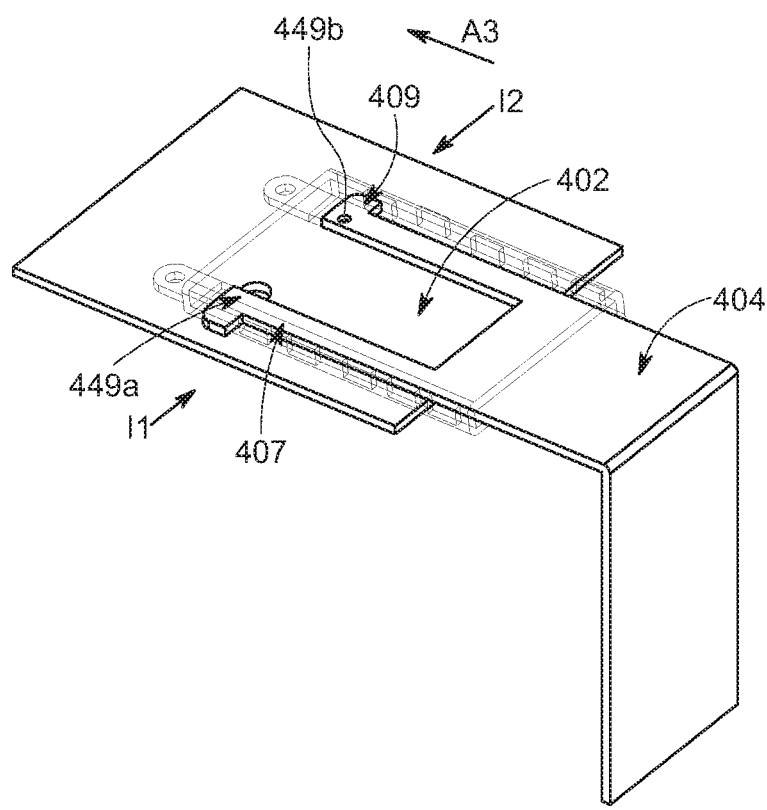
FIG. 30 is a perspective view illustrating the flexible modularized assembly of FIG. 28 after attachment of the movable plate.

Referring generally to FIGS. 28-30, movement of the first notch 449a is further described for adjusting the moving plate 404 relative to the fixing plate 402. Referring specifically to FIG. 28, both the first and second notches 449a, 449b are pressed in inward direction I1 and I2. The first and second notches 449a, 449b are sufficiently elastic to facilitate inward bending.

Referring specifically to FIG. 29, the movement along the inward direction I1 shows temporary deflection of the first notch 449a such that the front end 450 clears the entry side 462. Thus, in a deflected state 471 of the first notch 449a, the moving plate 404 can move in the adjustable direction A3. Although not specifically described, the second notch 449b (illustrated in FIG. 30) functions in a symmetrical manner to the first notch 449a.

Referring specifically to FIG. 30, the moving plate 404 is now attached to the fixing plate 402. The attachment is achieved after adjustably sliding the moving plate 404 in a desired position, in the adjustable direction A3. In the desired position, the first and second notches 449a, 449b are engaged in respective adjustable holes 407, 409. To adjust the moving plate 404 in a reverse direction relative to the adjustable direction A3, the first and second notches 449a, 449b are pressed inward in the inward directions I1 and I2. More specifically, the first and second notches 449a, 449b are pressed inward such that the trailing end 466 (shown in FIG. 27) of each notch 449a, 449b clears past the respective stop side 464 (shown in FIG. 27).

Figure 31:
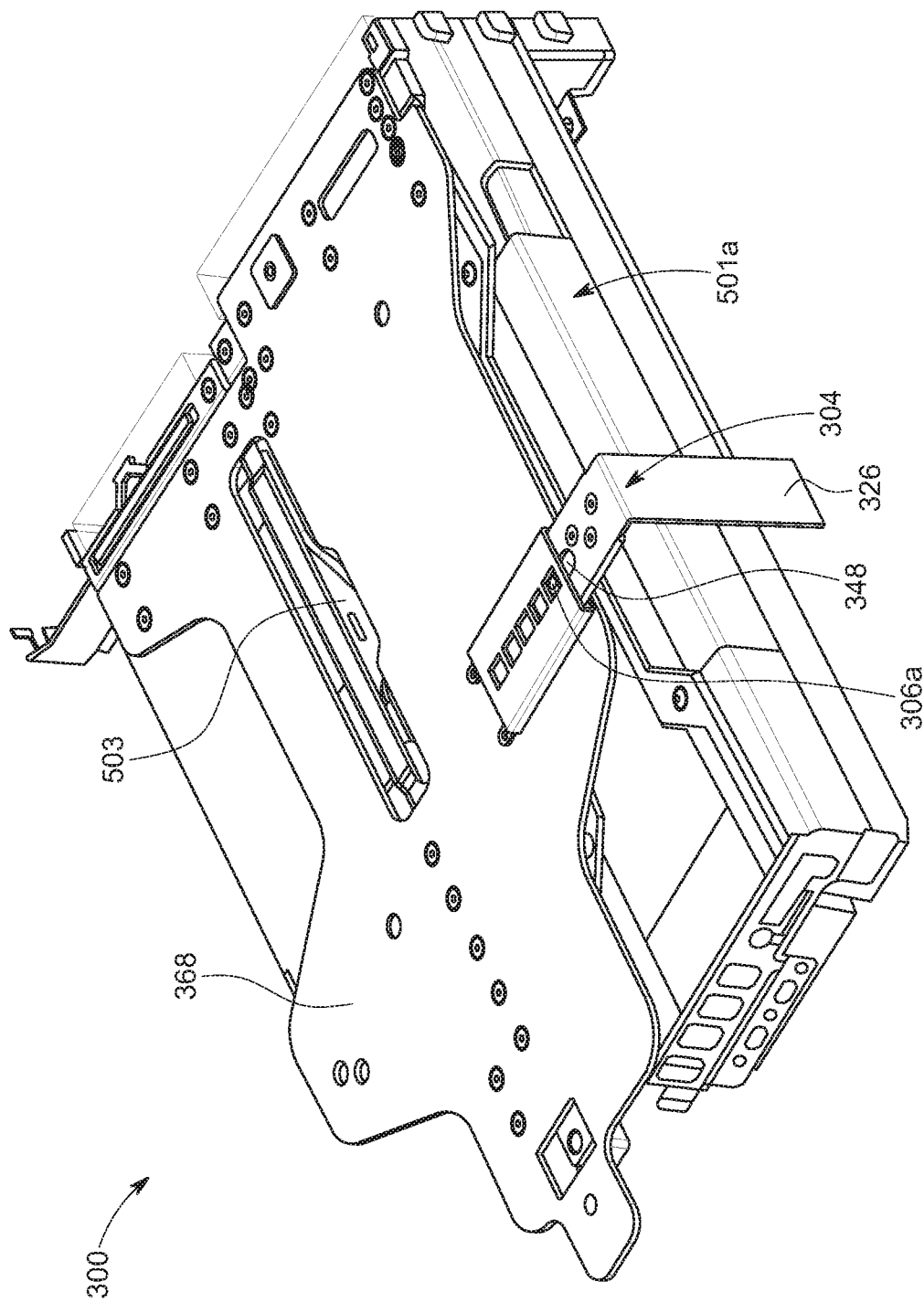
FIG. 31 is a perspective view illustrating a full-height GPU card mounted with a flexible modularized assembly having a single latch.
Figure 32:
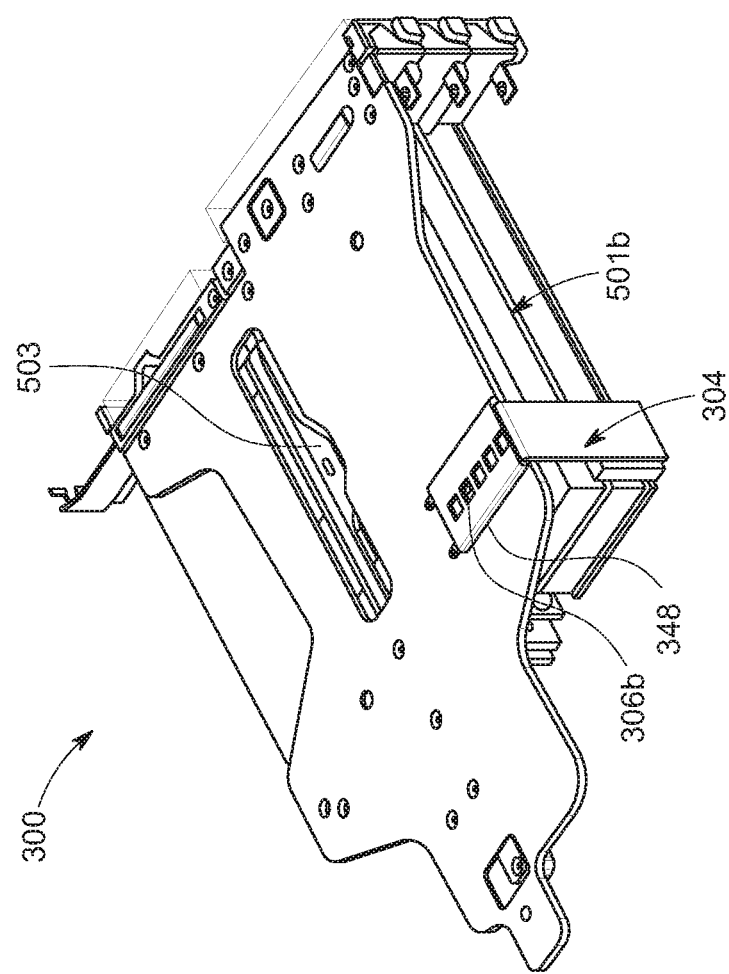
FIG. 32 is a perspective view illustrating a full-height GPU card mounted with a flexible modularized assembly having two latches.

Referring generally to FIGS. 31 and 32, the flexible modularized system 300 is adjustable for supporting, one at a time, either a first GPU card 501a (illustrated in FIG. 31) or a second GPU card 501b (illustrated in FIG. 32). Referring specifically to FIG. 31, the flexible modularized system 300 supports the first GPU card 501a, which has a full-height profile that is a different size than a low-profile of the second GPU card 501b. The first GPU card 501a is coupled to a PCB 503, to which the riser bracket 368 is fixedly coupled. The latch 348 (illustrated more clearly in FIG. 23) engages a first adjustable hole 306a (illustrated more clearly in FIG. 21) when the first GPU card 501a is coupled to the PCB 503. The second plate 326 is in contact with the first GPU card 501a when the latch 348 engages the first adjustable hole 306a. Consequently, the first GPU card 501a is secured to the PCB 503 with the moving plate 304.

Referring specifically to FIG. 32, the flexible modularized system 300 has been adjusted (in accordance with the disclosure provided above) to support the second GPU card

501*b*. The second GPU card 501*b* is now coupled to the PCB 503, with the first GPU card 501*a* (shown in FIG. 31) being replaced. The latch 348 engages a second adjustable hole 306*b* (illustrated more clearly in FIG. 22). Consequently, the second GPU card 501*b* is secured to the PCB 503 with the moving plate 304.

Figure 33:
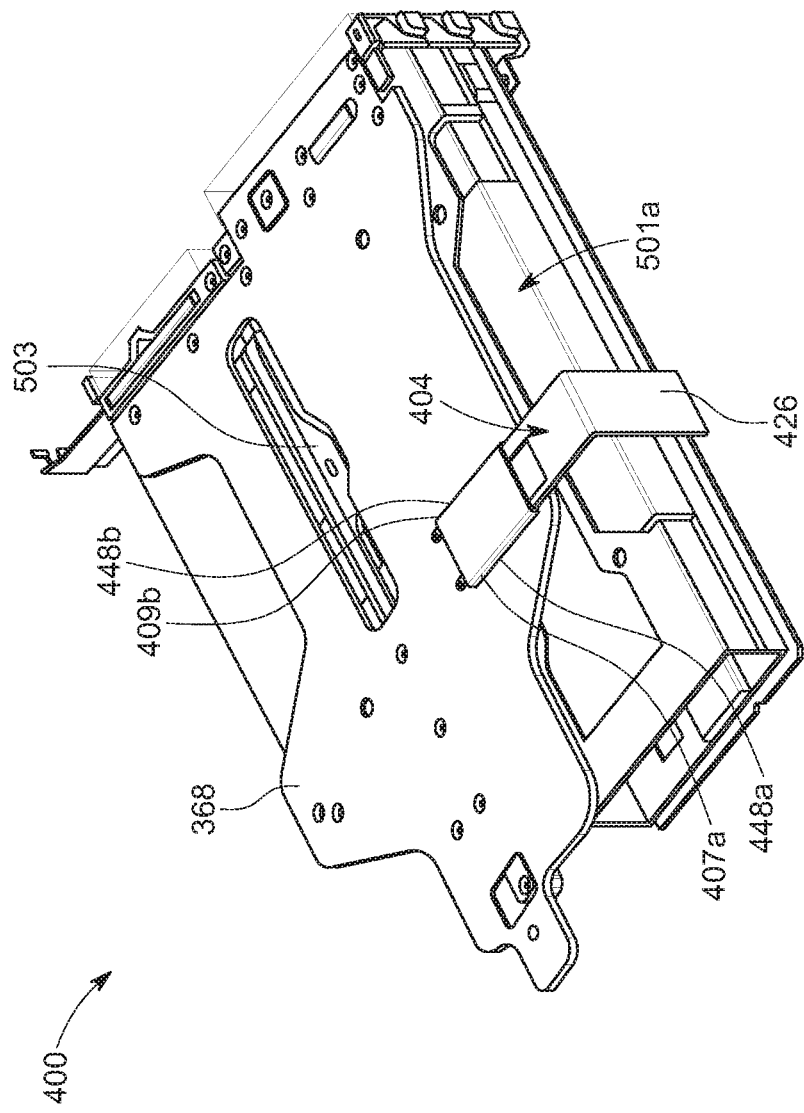
FIG. 33 is a perspective view illustrating a low-profile GPU card mounted with a flexible modularized assembly having a single latch.
Figure 34:
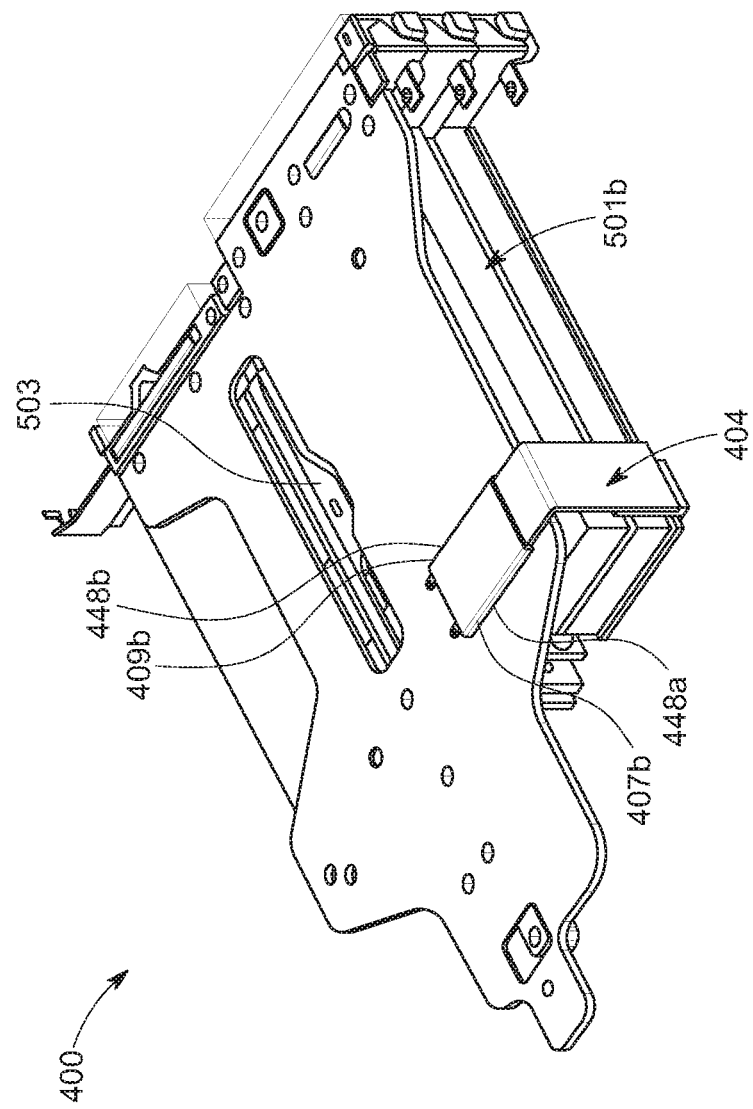
FIG. 34 is a perspective view illustrating a low-profile GPU card mounted with a flexible modularized assembly having two latches.

Referring generally to FIGS. 33 and 34, the flexible modularized system 400 is adjustable for supporting, one at a time, either the first GPU card 501*a* (illustrated in FIG. 3) or the second GPU card 501*b* (illustrated in FIG. 34). Referring specifically to FIG. 33, the flexible modularized system 400 supports the first GPU card 501*a*. The first GPU card 501*a* is coupled to the PCB 503, to which the riser bracket 368 is fixedly coupled. The latches 448*a*, 448*b* engage respectively the first adjustable holes 407*a*, 409*a* (illustrated more clearly in FIG. 24) when the first GPU card 501*a* is coupled to the PCB 503. A second plate 426 of the moving plate 404 is in contact with the first GPU card 501*a* when the latches 448*a*, 448*b* engage the respective ones of the first adjustable holes 407*a*, 409*a*. Consequently, the first GPU card 501*a* is secured to the PCB 503 with the moving plate 404.

Referring specifically to FIG. 34, the flexible modularized system 400 has been adjusted (in accordance with the disclosure provided above) to support the second GPU card 50 lb. The second GPU card 501*b* is now coupled to the PCB 503, with the first GPU card 501*a* (shown in FIG. 33) being replaced. The latches 448*a*, 448*b* engage respective ones of the second adjustable holes 407*b*, 409*b* (illustrated more clearly in FIG. 23). Consequently, the second GPU card 501*b* is secured to the PCB 503 with the moving plate 404.

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A flexible modularized system for supporting graphics processing unit (GPU) cards of different dimensions, the flexible modularized system comprising:
    a riser bracket having attachment features for being fixedly coupled to a printed circuit board (PCB);
    a fixing plate fixedly coupled to the riser bracket and including a plurality of adjustable holes, the plurality of adjustable holes including a first adjustable hole and a second adjustable hole; and
    a moving plate adjustably coupled to the fixing plate, the moving plate being movable between a plurality of positions, the plurality of positions including a first position that is different from a second position, the moving plate having a first end that including at least one latch, the at least one latch engaging the first adjustable hole in the first position and the second adjustable hole in the second position, the moving plate having a second end configured to secure in place one of the GPU cards relative to the PCB.

2. The flexible modularized system of claim 1, further comprising at least one fastener that fixes the fixing plate to the riser bracket.

3. The flexible modularized system of claim 2, wherein the at least one fastener is in the form of a T-shaped pin.

4. The flexible modularized system of claim 2, wherein the riser bracket includes at least one alignment aperture having an alignment hole connected to an alignment slot, the at least one fastener being initially received within the alignment hole, the at least one fastener being slidably movable along the alignment slot to a securing position, the fixing plate being fixed relative to the riser bracket in the securing position.

5. The flexible modularized system of claim 4, wherein the at least one fastener includes a pair of fasteners, the at least one alignment aperture including a pair of alignment apertures, each fastener of the pair of fasteners being simultaneously inserted within a respective one of the pair of alignment apertures for achieving the securing position.

6. The flexible modularized system of claim 1, wherein the plurality of adjustable holes extends between a proximal end and a distal end of the fixing plate, the proximal end is farthest from an outer edge of the riser bracket, the distal end being closest to the outer edge of the riser bracket, the proximal end and the distal end defining a length of the fixing plate.

7. The flexible modularized system of claim 6, wherein the plurality of adjustable holes is centrally located along a planar surface between lateral edges of the fixing plate, the lateral edges defining a width of the fixing plate.

8. The flexible modularized system of claim 6, wherein the plurality of adjustable holes includes a first set of adjustable holes and a second set of adjustable holes, the first set of adjustable holes being located along a first side of the fixing plate, the second set of adjustable holes being located along a second side of the fixing plate, the first side extending along a thickness of the fixing plate from a first lateral edge of the fixing plate, the second side extending along the thickness of the fixing plate from a second lateral edge of the fixing plate, the first lateral edge and the second lateral edge defining a width of the fixing plate.

9. The flexible modularized system of claim 1, wherein the at least one latch is centrally located along a planar surface between lateral edges of the moving plate, the lateral edges defining a width of the moving plate.

10. The flexible modularized system of claim 9, wherein the at least one latch has an arc-shaped element that is in a depressed state when the moving plate is adjusted between positions of the plurality of position, the arc-shaped element automatically rebounding to an undepressed state when the moving plate is in one of the plurality of positions.

11. The flexible modularized system of claim 1, wherein the at least one latch includes a first latch and a second latch, the first latch being located along a first side of the moving plate, the second latch being located along a second side of the moving plate, the first side extending along a thickness of the moving plate from a first lateral edge of the moving plate, the second side extending along the thickness of the moving plate from a second lateral edge of the moving plate, the first lateral edge and the second lateral edge defining a width of the moving plate.

12. The flexible modularized system of claim 11, wherein the first latch has a first notch and the second latch has a second notch, the first notch being symmetrical to the second notch relative to a central axis of the moving plate, the central axis extending parallel to the first lateral edge and the second lateral edge.

13. The flexible modularized system of claim 1, wherein the fixing plate includes at least one locating protrusion, the riser bracket including at least one locating dimple, the at least one locating protrusion being received within the at least one locating dimple when the fixing plate is aligned to the riser bracket in a fixed position.

14. A method for supporting a plurality of graphics processing unit (GPU) cards with a flexible modularized system, the plurality of GPU cards including a first GPU card with a first set of dimensions and a second GPU card with a second set of dimensions, the first set of dimensions being different than the second set of dimensions, the method comprising:
    fixedly coupling a riser bracket to a printed circuit board (PCB);
    fixedly coupling a fixing plate to the riser bracket, the fixing plate having a plurality of adjustable holes including a first adjustable hole and a second adjustable hole;
    adjustably coupling a moving plate to the fixing plate in a first position of the flexible modularized system, the first position corresponding to the first GPU card, the moving plate having at least one latch;
    engaging, in the first position, the at least one latch to the first adjustable hole;
    securing, in the first position, the first GPU card to the PCB with the moving plate;
    movably adjusting the at least one latch to engage the second adjustable hole in a second position of the flexible modularized system; and
    securing, in the second position, the second GPU card to the PCB with the moving plate.

15. The method of claim 14, further comprising sliding fasteners of the fixing plate into receiving alignment slots of the riser bracket.

16. The method of claim 14, further comprising depressing the at least one latch to disengage from the first adjustable hole.

17. The method of claim 14, further comprising releasing the at least one latch to automatically engage the second adjustable hole.

18. A flexible modularized system for supporting graphics processing unit (GPU) cards of different dimensions, the flexible modularized system comprising:
    a riser bracket fixedly coupled to a printed circuit board (PCB);
    a fixing plate mounted to the riser bracket, the fixing plate having a plurality of adjustable holes including a first adjustable hole and a second adjustable hole; and
    a moving plate adjustably coupled to the fixing plate, the moving plate having a first plate that is generally perpendicularly connected to a second plate, the first plate having a latch that engages the first adjustable hole when a first GPU card is coupled to the PCB, the second plate being in contact with the first GPU card when the latch engages the first adjustable hole, the moving plate being slidably movable to have the latch engage the second adjustable hole when a second GPU card is coupled to the PCB, the first GPU card having a different size than the second GPU card, the second plate being in contact with the second GPU card when the latch engages the second adjustable hole.

19. The flexible modularized system of claim 18, wherein the latch is located within a latch aperture of the first plate, the latch being located along a top side of the first plate, the latch consisting of an elastic material that automatically returns to an undepressed state, the undepressed state being achieved after the latch is pressed to disengage a respective one of the plurality of adjustable holes, the plurality of adjustable holes being located along a top side of the fixing plate.

20. The flexible modularize system of claim 18, wherein the latch includes a pair of lateral arms, each of the lateral arms being located along a respective lateral side of the first plate, each lateral side extending generally perpendicularly from a top side of the first plate, each of the lateral arms including a notch for engaging a respective one of the plurality of adjustable holes, each of the lateral arms consisting of an elastic material that automatically returns to an undepressed state, the undepressed state being achieved after the lateral arms are pressed to disengage a respective one of the plurality of adjustable holes, the plurality of adjustable holes including two sets of adjustable holes that are located along a respective lateral side of the fixing plate.

* * * * *